(12) United States Patent
Litwin et al.

(10) Patent No.: US 6,319,848 B1
(45) Date of Patent: Nov. 20, 2001

(54) INHOMOGENOUS COMPOSITE DOPED FILM FOR LOW TEMPERATURE REFLOW

(75) Inventors: Andrej Litwin, Stockholm (SE); Shih-Hsin Ying, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 08/405,063

(22) Filed: Mar. 16, 1995

Related U.S. Application Data

(62) Division of application No. 08/136,640, filed on Oct. 12, 1993, now abandoned.

(51) Int. Cl.[7] .................................................. H01L 21/441
(52) U.S. Cl. .......................... 438/761; 438/778; 438/787
(58) Field of Search .................................. 437/235, 238, 437/240, 978, 982, 228; 148/DIG. 133; 438/761, 778, 787, 795, 760

(56) References Cited

U.S. PATENT DOCUMENTS

| | | | |
|---|---|---|---|
| 4,948,743 | * 8/1990 | Ozaki | 437/40 |
| 5,004,704 | * 4/1991 | Maeda et al. | 437/195 |
| 5,066,612 | * 11/1991 | Ohba et al. | 437/978 |
| 5,094,984 | * 3/1992 | Liu et al. | 437/235 |
| 5,166,101 | * 11/1992 | Lee et al. | 437/238 |
| 5,204,288 | * 4/1993 | Marks et al. | 437/240 |
| 5,268,333 | * 12/1993 | Lee et al. | 437/235 |
| 5,278,103 | * 1/1994 | Mallon et al. | 437/240 |

FOREIGN PATENT DOCUMENTS

| | | | |
|---|---|---|---|
| 62-1246 | * 1/1987 | (JP) | 437/240 |
| 1-128449 | * 5/1989 | (JP) | 437/240 |
| 62-14444 | * 1/1987 | (JP) | 437/978 |
| 62-235739 | * 10/1987 | (JP) | 437/978 |
| 62-274641 | * 11/1987 | (JP) | 437/978 |

\* cited by examiner

*Primary Examiner*—Savitri Mulpuri
(74) *Attorney, Agent, or Firm*—Wade James Brady, III; Frederick J. Telecky, Jr.

(57) ABSTRACT

Lower reflow temperature in dielectrics is obtained by using a composite dielectric film. The composite dielectric film includes a first layer doped in the conventional range. A borophosphosilicate glass (BPSG) thick layer having concentrations of around 4.4 wt. % boron and around 5.6 wt. % phosphorus is exemplary. The composite dielectric film includes a second layer doped excessively. A BPSG thin layer having concentrations between 1–4 wt. % phosphorus and between 7–8 wt. % boron is exemplary. A capping layer of conventional dopant concentration may be additionally added to prevent outdiffusion. A composite dielectric BPSG film can be reflowed around 700° C. as compared to the typical 800–900° C. range. After reflow, etching away the second highly doped layer removes any potential adverse effects.

3 Claims, 1 Drawing Sheet

INHOMOGENOUS COMPOSITE DOPED FILM FOR LOW TEMPERATURE REFLOW

This is a Division, of application Ser. No. 08/136/640, filed Oct. 12, 1993 now abandoned.

FIELD OF THE INVENTION

The present invention relates in general to the field of integrated circuits and more specifically to dielectric films used in fabricating such circuits.

BACKGROUND OF THE INVENTION

Dielectric materials are used in manufacturing integrated circuits. As described in *VLSI TECHNOLOGY*, second edition, by S. M. Sze, 1988, on page 234, dielectric materials have many purposes, such as insulation between conducting layers, diffusion and ion implantation masks, diffusion from doped oxides, capping doped films to prevent the loss of dopant, gettering impurities, and as passivation to protect devices from impurities, moisture and scratches.

Phosphorus doped silicon dioxide (PSG) is one such dielectric material. It is frequently used as an insulator between polysilicon gates and top metallization. U.S. Pat. No. 5,112,762, issued May 12, 1992, illustrates in FIG. 3 a high density dynamic random access memory, DRAM, device having a multilevel oxide (MLO) oxide layer 30 that could be formed of PSG.

Phosphorus in an interlevel oxide isolation between conductive layers act as an ion migration barrier, but the main reason for doping is to decrease the reflow temperature as explained in *SEMICONDUCTOR INTEGRATED CIRCUIT PROCESSING TECHNOLOGY* by Runyan and Bean, 1990, pages 143–145. Reflowing the PSG helps reduce the topography which is good for depositing metal. A problem in interlevel connections is that etching process for forming contact apparatuses through the interlevel oxide may produce openings with sharp edges. If the softening point of the interlevel oxide can be reduced enough, then it can be reflowed after the openings are made in order to round off the abrupt edges. Similarly, after an oxide is deposited over a series of leads, the abrupt shoulders can be smoothed by reflowing. PSG softens and reflows at a relatively high temperature between 950 to 1100 C. Typical dopant concentrations in PSG are about 6 to 8 wt. % phosphorus concentration. See *VLSI TECHNOLOGY* page 234 and pages 255–258.

Another dielectric material commonly used is borophosphosilicate glass (BPSG). Multilevel oxide (MLO) layer 30 of the above U.S. Pat. No. 5,112,762 could be formed of BPSG. BPSG is formed by adding boron to PSG. Adding boron to PSG provides an advantage of lowering the reflow temperature of PSG. Typical reflow temperatures for BPSG are between between 800 to 900 C. Typical dopant concentrations are 1 to 4 wt. % boron and 4 to 6 wt. % phosphrous. See *VLSI TECHNOLOGY* page 257.

It is desirable to lower the reflow temperature of dielectric films to avoid disturbing modern shallow junction transistor devices. Modern VLSI circuit devices, such as the 16M bit DRAM in the above U.S. Pat. No. 5,112,762 have shallow junction transistors in the memory array and periphery. The source/drain regions of the transistors are formed, as for example, by ion implantation before applying a dielectric material such as BPSG. Thus, the reflow is commonly referred to as a "back end" operation; that is, an operation occurring after formation of the transistors. Exposing the source/drain regions to too high a reflow temperature in the back end adversely disturbs the dopant concentration in the source/drain regions.

One way to achieve lower reflow temperatures is to increase the content of the dopant species. By increasing the boron and phosphorus concentration in a BPSG layer, the reflow can be lowered. However, this is undesirable because too high levels of these dopants produce a deleterious influence on the film properties. Phosphorus concentrations above 7%–8% wt. may cause corrosion of the aluminum metallization by the acid products formed from the reaction between the phosphorus in the oxide and atmospheric moisture. Boron contents above about 4% make a glass unstable in high humidity. Bubbles of volatile phosphorus oxides and crystallites of boron-rich phases can occur unless the dopant concentrations are carefully controlled.

It is desirable therefore, and accordingly an object of the invention, to provide a dielectric material having low temperature reflow characteristics.

It is an additional object of the invention to lower the reflow temperature of doped dielectric films.

It is a further object of the invention to provide an improved BPSG film.

Other objects and advantages of the invention will be apparent to those of ordinary skill in the art having reference to the following specification and drawings.

SUMMARY OF THE INVENTION

An inhomogeneous dielectric film provides for lower temperature reflow. A first layer having conventional dopant concentration is formed. A second abutting layer is excessively doped with respect to the first layer. The second layer initiates reflow at a lower temperature. A third abutting layer may be added to hinder out diffusion of dopant from the second layer. An exemplary composite dielectric film is a BPSG film having a first layer concentration of about 4.4 wt % boron and about 5.6 wt. % phosphorus. The second highly doped layer contains about 7 to 8 wt. % boron and about 1 to 4 wt. % phosphorus. Utilizing such a BPSG scheme reduces the anneal temperature necessary to reflow the BPSG from about 800 to 900 C. to about 700 C. or less. The second layer is a sacrificial layer that may be removed during subsequent etching and thus provides no adverse effects from its higher dopant concentration.

DETAILED DESCRIPTION OF THE PREFERRED EMBODIMENT

As the following description will reveal, a key aspect of the invention is the addition of an excessively doped film to initite a reflow at a lower temperature than is possible with a conventional film. Providing a second more highly doped film over a first doped film significantly lowers the reflow temperature characteristics of the first doped film while keeping other film properties practically unchanged. While the below description is cast in terms of BPSG as an exemplary example, the invention is not limited to BPSG and is applicable to doped films in general including, but not limited to, PSG, arsenic doped silicate glass (ASG), and boron arsenic silicate glass (BSAG).

Figure 1:
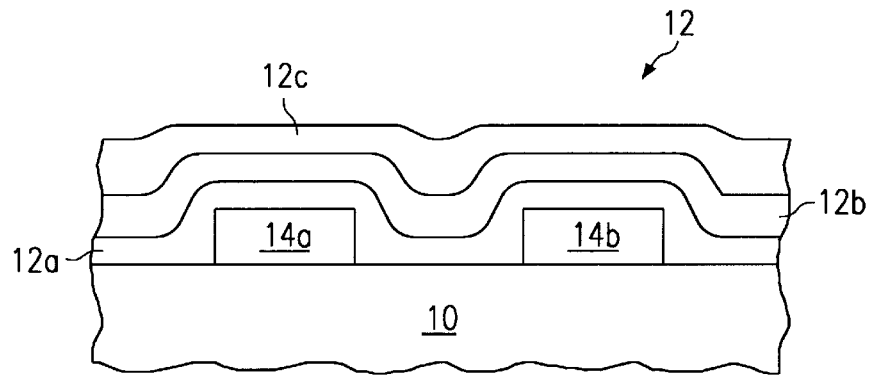
FIGS. 1–3 illustrate successive steps in preparing a semiconductor wafer.
Figure 2:
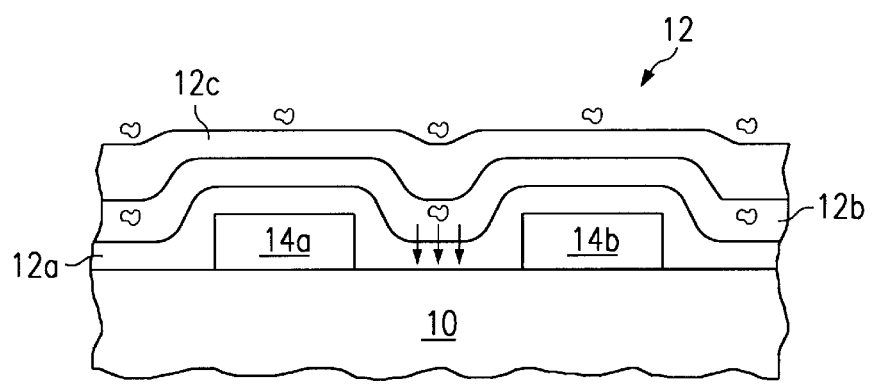
Figure 3:
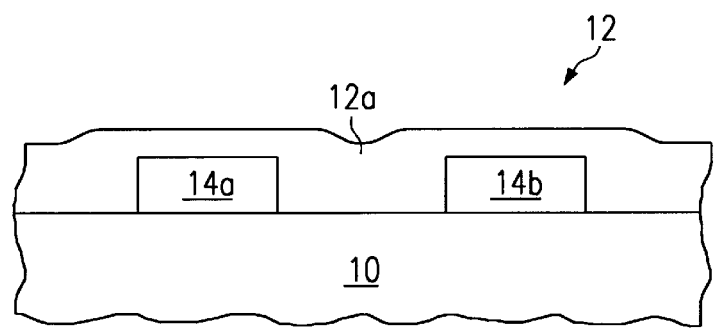

FIGS. 1–3 represent a process flow of a semiconductor wafer prepared when utilizing the invention. In FIG. 1, a semiconductor wafer 10 is prepared having a doped film layer 12 in accordance with a preferred embodiment of the invention. Semiconductor wafer 10 is representative of any generic wafer and may include, for example, VLSI devices such as a DRAM of the 16M bit or 64 M bit variety having shallow junction devices thereon. In a DRAM application, devices 14a and 14b may represent word lines forming transistor gates in the memory array of the DRAM; they may additionally represent gates of transistors in the DRAM periphery.

In FIG. 1, doped film 12 is formed primarily of two components: a first layer 12a and an overlying abutting layer 12b. A third overlying layer 12c may be added. First layer 12a overlies devices 14a and 14b. First layer 12a may be a thick BPSG film with conventional phosphorus and boron content. As an example, it may be about 1.8 microns thick having a concentration of about 4.4 wt. % boron and about 5.6 wt. % phosphorus and may be formed by conventional deposition.

In FIG. 1, second layer 12b may be a BPSG film having higher dopant concentration. The higher dopant concentration may be phosphorus only, boron only, or both. One example is a phosphorus concentration between 1–4 wt. % in combination with a boron concentration between 7–8 wt. %. While layer 12b could be a thick film, it need not be so. As illustrated in FIG. 1, layer 12b is a thin film of about 1000 Å (angstroms). Layer 12b may be deposited in situ on top of layer 12a or deposited as a separate step. The higher dopant concentration in layer 12b initiates reflow of layer 12 at a much lower temperature; it is possible to reflow composite BPSG, for example, below 750° C.–700° C. (It is also possible to reflow ASG, for example, at a temperature of about 750° C.)

FIG. 1 also illustrates an additional overlying layer 12c. Layer 12c is deposited with dopant concentration lower than layer 12b. While layer 12c is not necessary to practice the invention, it does provide an added advantage in that it functions to cap layer 12b and hinder out diffusion. Layer 12c, in the BPSG example, may contain conventional dopant concentrations such as 4.4 wt. % boron and 5.6 wt. % phosphorus. Layer 12c need not be thick layer; it may be thinner than layer 12b may be around 500 Å.

Referring now to FIG. 2, wafer 10 of FIG. 1 is illustrated undergoing reflow. Heating layer 12 causes it to planarize, reflow, or smooth out. Because layer 12b has a higher dopant concentration level than layer 12a, reflow begins at a lower temperature. The exact amount of time needed to accomplish the reflow will, of course, vary depending upon the thickness of layer 12a. In the BPSG example described above, heating layer 12 for about 20 minutes at a temperature of approximately 700° C. will be sufficient.

FIG. 3 illustrates the resulting wafer 10 after reflow with layers 12b and 12c being removed. Layer 12b (and layer 12c) are preferably removed after the low temperature reflow occurs. Removal may be accomplished by etching, such as utilizing a 1% hydrogen flourine etchant. The etch should be timed to remove layers 12b and 12c and to etch layer 12a to the desired thickness that is, of course, dictated by design rules. As an example, in manufacturing a VLSI multilevel metal device such as a 16M DRAM, the etch may be about 11,500 Å deep. Because highly doped layer 12b is removed, the later added metal suffers no adverse effects.

Layer 12b is thus a sacrificial layer providing advantages of lowering reflow temperature without disadvantages of corrosion.

The above description provides illustrative details for practicing the invention generally. Specific exemplary examples of process flows follow below.

In example one, a process flow is given for forming a multilevel oxide (MLO) layer in a multilevel metal device such as a 16M DRAM. This process flow could be used to form the previously mentioned MLO layer 28 of FIG. 3 of U.S. Pat. No. 5,112,762. In that patent, the MLO layer 28 provides isolation between the silicided polysilicon bitlines a Metal-1 interconnect. A low pressure CVD step first forms an oxide layer about 1000 Å thick on a semiconductor wafer. A plasma enhanced CVD step then forms a first BPSG film of about 1.8 microns thick having a concentration of about 4.4 wt. % boron and about 5.6 wt. % phosphorus. An in situ deposition step then forms a BPSG film of about 1000 A thick having a concentration of about 7–8 wt. % boron and between about 1–4 wt. % phosphorus over the first BPSG layer. Another in situ deposition step then forms a third BPSG film of about 500 Å thick having concentration of about 4.4 wt. % boron and about 5.6 wt. % phosphor. A low temperature anneal occurs in a furnace heated to around 700° C. which causes the BPSG film to reflow and smooth. A BPSG etch follows wherein about 11,500 Å removes the third BPSG film, the second BPSG film, and partially removes the first BPSG film. The wafer may then be patterned for contacts, etched to form contact openings in the memory array and the periphery, and forwarded to a metal module whereupon metal will be placed into the contact openings, for example by sputtering, to form the interconnect.

In example two, a process flow is given for forming a metal interlevel oxide (MILO) layer in a multilevel metal device such as a 64M DRAM. This process flow could also be used to form MILO layer 24 of FIG. 3 of U.S. Pat. No. 5,112,762. In that patent, the MILO layer 24 provides isolation between the metal-1 interconnect and the metal-2 interconnect layer. A plasma enhanced CVD step first forms an oxide layer about 2000 Å thick on a semiconductor wafer over the metal-1 interconnect. A plasma enhanced CVD step then forms a first BPSG film of about 1.8 microns thick having a concentration of about 4.4 wt. % boron and about 5.6 wt. % phosphorus. An in situ deposition step then forms a BPSG layer of about 1000 Å thick having a concentration of about 7–8 wt. % boron and between about 1–4 wt. % phosphour over the first BPSG layer. Another in situ deposition step then forms a third BPSG layer of about 500 Å thick having concentration of about 4.4 wt. % boron and about 5.6 wt. % phosphorus. A low temperature anneal occurs in a furnace heated to around 700° C. which causes the BPSG film to reflow and smooth. A BPSG etch follows wherein about 12,500 Å removes the third BPSG film, the second BPSG film, and partially removes the first BPSG film. Then about 1000 Å of plasma enhanced CVD oxide is deposited. The wafer may then be patterned for vias, etched to form the via openings, and forwarded to the metal-2 module whereupon metal will be placed into the vias, as for example by sputtering.

In summary, the addition of an excessively doped film to an existing film initites a reflow at a lower temperature than is possible with a conventional film. BPSG may be reflowed below 750° C. at approximately 700° C. A composite, or inhomogenous, film is thus provided having improved reflow characterestics. A third conventionally doped film may be added which caps the second doped film and prevents outdiffusion of the second highly doped film. Lowering the reflow temperature is particularly advantageous when manufacturing VLSI devices having shallow junction devices as it aids in avoidance of disturbing the dopant concentrations in the shallow junctions, and thereby helps in providing less defective, and thus more manufacturable, semiconductor devices.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of forming an inhomogeneous doped film for low temperature reflow, comprising the steps of:
    forming a first BPSG layer having dopant concentration around 4.4 wt. % boron and around 5.6 wt. % phosphorus;
    forming a second abutting and overlying BPSG layer having dopant concentration between around 1–4 wt. % phosphorus and between around 7–8 wt. % boron; and
    reflowing the first and second BPSG layers near 700° C.

2. The method of claim 1 comprising the additional step of:
    forming a third BPSG layer abutting and overlying the second BPSG layer before the step of reflowing the first and second BPSG layers, the third BPSG layer having dopant concentration around 4.4 wt. % boron and around 5.6 wt. % phosphorus.

3. The method of claim 2 wherein the first BPSG thick layer is greater than 1 micron thick and the second BPSG thin layer is around 1000 Å thin.

* * * * *